United States Patent
Chen et al.

(10) Patent No.: US 8,278,737 B2
(45) Date of Patent: Oct. 2, 2012

(54) STRUCTURE FOR IMPROVING DIE SAW QUALITY

(75) Inventors: Hsien-Wei Chen, Sinying (TW); Hao-Yi Tsai, Hsinchu (TW); Ying-Ju Chen, Tuku Township, Yulin County (TW); Yu-Wen Liu, Taipei (TW); Shin-Puu Jeng, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 666 days.

(21) Appl. No.: 12/417,394

(22) Filed: Apr. 2, 2009

(65) Prior Publication Data

US 2010/0252916 A1   Oct. 7, 2010

(51) Int. Cl.
  *H01L 21/00*   (2006.01)
(52) U.S. Cl. .......... 257/620; 257/618; 257/786
(58) Field of Classification Search .......... 257/618, 257/620, 786
  See application file for complete search history.

(56) References Cited

U.S. PATENT DOCUMENTS

| | | | |
|---|---|---|---|
| 6,171,976 B1 * | 1/2001 | Cheng | 438/760 |
| 6,693,357 B1 * | 2/2004 | Borst et al. | 257/773 |
| 7,057,296 B2 * | 6/2006 | Hung et al. | 257/786 |
| 7,126,225 B2 | 10/2006 | Su et al. | |
| 7,183,137 B2 * | 2/2007 | Lee et al. | 438/114 |
| 7,233,075 B2 | 6/2007 | Hung et al. | |
| 7,294,937 B2 * | 11/2007 | Su et al. | 257/797 |
| 7,576,411 B2 * | 8/2009 | Sasaki et al. | 257/620 |
| 7,952,167 B2 * | 5/2011 | Lee et al. | 257/618 |
| 2007/0040242 A1 * | 2/2007 | Sasaki et al. | 257/620 |
| 2008/0194076 A1 * | 8/2008 | Chang et al. | 438/455 |
| 2008/0265378 A1 * | 10/2008 | Lee et al. | 257/620 |
| 2010/0252916 A1 * | 10/2010 | Chen et al. | 257/620 |

* cited by examiner

*Primary Examiner* — Laura Menz
(74) *Attorney, Agent, or Firm* — Haynes and Boone, LLP

(57) ABSTRACT

A semiconductor device is provided that includes a semiconductor substrate, a plurality of dies formed on the semiconductor substrate, the plurality of dies being separated from one another by a first region extending along a first direction and a second region extending along a second direction different from the first direction, a dummy metal structure formed within a third region that includes a region defined by an intersection of the first region and the second region, a plurality of metal interconnection layers formed over the substrate, and a plurality of dielectric layers formed over the substrate. Each of the metal interconnection layers is disposed within each of the dielectric layers and a dielectric constant of at least one of the dielectric layers is less than about 2.6.

10 Claims, 6 Drawing Sheets

STRUCTURE FOR IMPROVING DIE SAW QUALITY

BACKGROUND

The present disclosure relates generally to semiconductor manufacturing technology and, more particularly to a structure and method for improving die saw quality.

In semiconductor processing, a plurality of dies, each containing an integrated circuit, may fabricated on a semiconductor wafer. Scribe lines may be provided between adjacent dies so that the dies can be separated without damaging the circuit during processing. Typically, stresses induced by semiconductor back-end-of-line (BEOL) processes, such as die-sawing, packing, and plastic modeling, cause serious peeling and delamination starting from the die corners. Existing methods include die saw blade improvement and seal ring consolidation. Although these approaches have been satisfactory for their intended purposes, they have not been satisfactory in all respects. Accordingly, severe peeling and/or delamination resulting from BEOL processing are still observed, particularly in the die corner areas. Thus, what is needed is a cost-effective semiconductor structure that improves die saw quality.

SUMMARY

One of the broader forms of the present disclosure involves a semiconductor device that includes: a semiconductor substrate; a plurality of dies formed on the semiconductor substrate, the plurality of dies being separated from one another by a first region extending along a first direction and a second region extending along a second direction different from the first direction; a dummy metal structure formed within a third region that includes a region defined by an intersection of the first region and the second region; and a plurality of metal interconnection layers formed over the substrate, each of the plurality of metal interconnection layers being disposed within one of a plurality of dielectric layers and where a dielectric constant of at least one of the plurality of dielectric layers is less than about 2.6.

Another of the broader forms of the present disclosure involves a semiconductor wafer having a plurality of metal interconnection layers each being disposed in one of a plurality of dielectric layers formed over the wafer, the semiconductor wafer including: a first scribe line having a first width and extending along a first direction; a second scribe line having a second width and extending along a second direction different from the first direction; a plurality of dies being separated from each other by the first and second scribe lines; a central area defined by an intersection of the first scribe line and the second scribe line, the central area including first and second sides having the first width and third and fourth sides having the second width; a first area defined within the first scribe line, the first area extending a first distance from the first side of the central area; a second area defined within the first scribe line, the second area extending a second distance from the second side of the central area; a third area defined within the second scribe line, the third area extending a third distance from the third side of the central area; a fourth area defined within the second scribe line, the fourth area extending a fourth distance from the fourth side of the central area; and a plurality of dummy metal features formed in at least one of the dielectric layers, the plurality of dummy metal features being disposed within the central area and at least one of the first, second, third, and fourth areas.

Still another of the broader forms of the present disclosure involves a semiconductor device that includes: a semiconductor substrate having a plurality of circuit areas and a scribe line area that separates one circuit area from the other ones of the circuit areas; a plurality of metal interconnection layers and dielectric layers formed over the substrate, each metal interconnection layer being disposed in one of the dielectric layers, the dielectric layers including a first dielectric layer having a dielectric constant less than 2.6 and a second dielectric layer having a dielectric constant greater than 2.6; and a plurality of dummy metal features located within the scribe line area, the dummy metal features being formed in the first dielectric layer and the second dielectric layer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
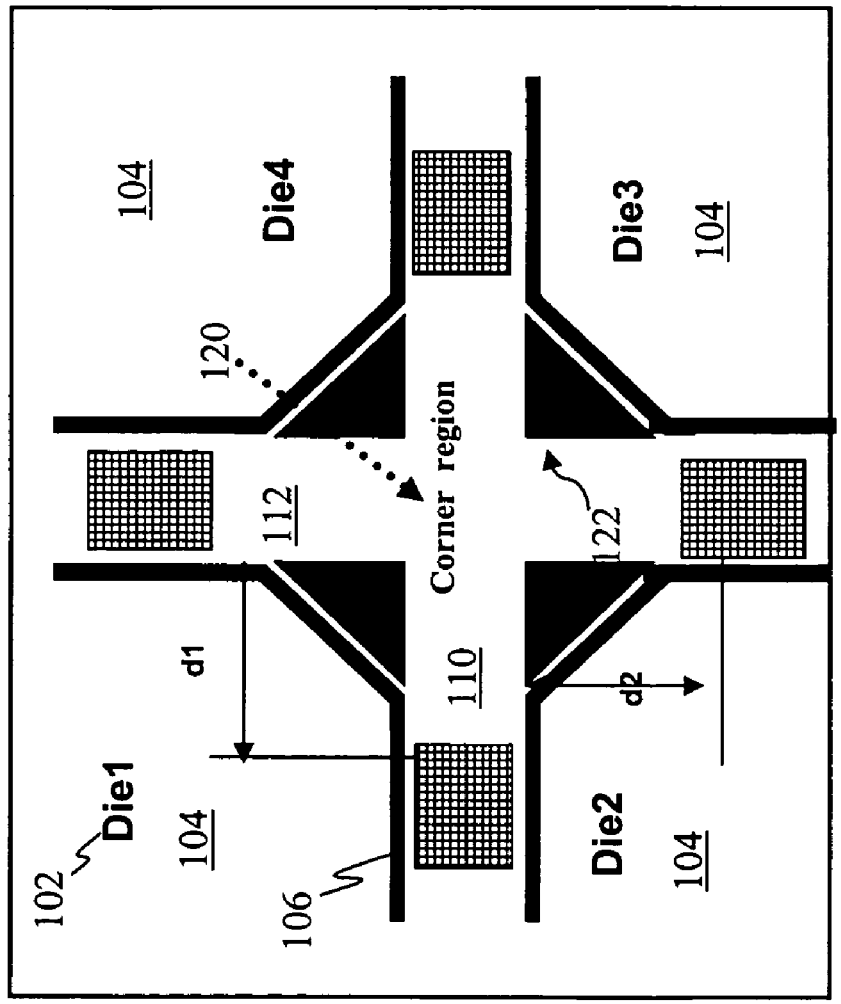
FIG. 1 is a top view of part of a semiconductor wafer without a dummy metal structure located within a corner region.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Further, the formation of a first feature adjacent to, proximate to, or next to a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a top view of part of a semiconductor wafer 100 including a plurality of dies (or chips) 102 formed therein (e.g., Die1, Die2, Die3, and Die4). Each semiconductor die 102 may include an integrated circuit region 104 and a seal ring 106. The integrated circuit region 104 may include a variety of active and passive devices in various embodiments, such as metal-oxide-semiconductor field effect transistors (MOSFETs), bipolar junction transistors (BJTs), high power transistors, high frequency transistors, memory cells, devices having fuse features, resistors, capacitors, inductors, diodes, other suitable components, or combinations thereof. It is understood that the semiconductor wafer 100 may further include other features, such as die-corner-circuit-forbidden (DCCF) regions or registration features.

The seal ring 106 may surround the perimeter of the integrated circuit region 106. The seal ring 106 may provide a barrier to penetration of moisture, corrosive gasses, and chemicals into the interior of the integrated circuit region 104. The seal ring 106 may comprise multiple layers. For example, the seal ring may comprise a plurality of conductive layers, a plurality of insulating layers, a plurality of vias and contacts, a plurality of metal layers, and/or combinations thereof.

Each die 102 may be separated and isolated from the other dies by a scribe line area. The scribe line area may include scribe lines 110 extending along a first direction and scribe lines 112 extending along a second direction perpendicular to the first direction. When the semiconductor wafer 100 is cut or diced into individual dies, the semiconductor wafer 100 is cut/diced along the scribe lines 110, 112. In some embodiments, the scribe lines may be evenly spaced and parallel to each other. The scribe line area may include a corner region 120 that is proximate to the corners 122 of adjacent dies 102 where the scribe line 110 intersects with the scribe line 112. The corner region 120 may further include portions of the scribe line 110 that extend a distance (d1) from the intersecting region (at both sides) and portions of the scribe line 112 that extend a distance (d2) from the intersecting region (at both sides). The corner region 120 may include a plurality of dielectric layers (e.g., inter-layer dielectric layers of an multi-layer interconnection structure) where at least one of the dielectric layers is a low-k material as will be discussed in detail below.

Dicing the semiconductor wafer 100 into the individual semiconductor dies 102 by sawing along the scribe lines 110, 112 creates high stress on the semiconductor dies 102. It has been observed that such stress often causes peeling and/or delamination at an interface of the material layers, such as the dielectric layers of the interconnection structure, particularly in the corner region 120 where stress may be at a maximum. Thus, the peeling and/or delamination may potentially reach the integrated circuit region 104 of the die 102 which can adversely affect device performance and in some cases cause device failure.

Figure 2:
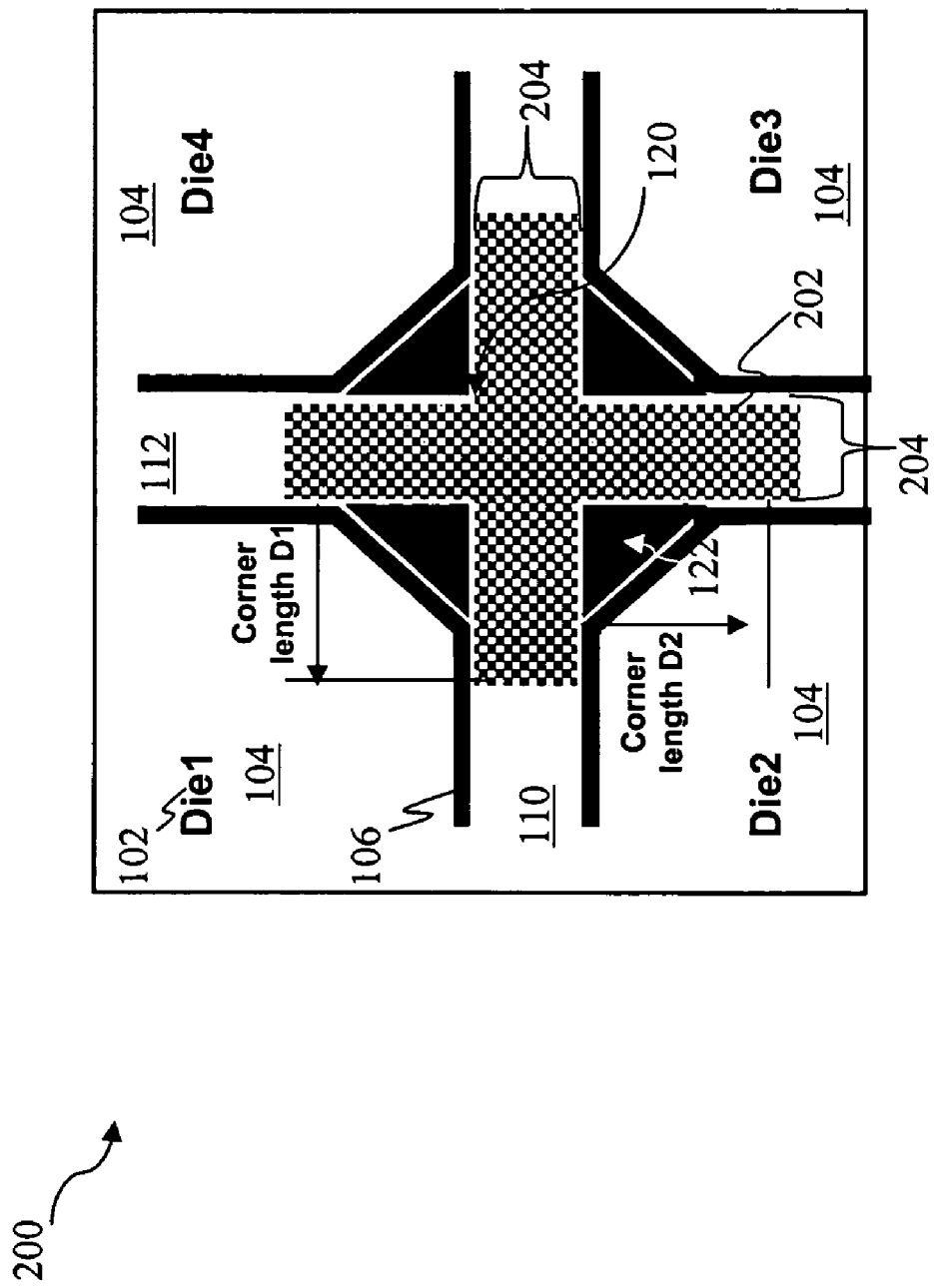
FIG. 2 is a top view of part a semiconductor wafer with a dummy metal structure located within a corner region that improves die saw quality according to various aspects of the present disclosure.

Referring to FIG. 2, illustrated is a top view of part of a semiconductor wafer 200 with a dummy metal structure located within a corner region according to various aspects of the present disclosure. The semiconductor wafer 200 is similar to the semiconductor wafer 100 of FIG. 1. Accordingly, similar features in FIGS. 1 and 2 are numbered the same for the sake of clarity and simplicity. The semiconductor wafer 200 may include a plurality of semiconductor dies 102 (e.g., Die1, Die2, Die3, Die4) that are separated and isolated from one another by scribe lines 110 and 112. The semiconductor wafer 200 may include a corner region 120 that includes a region where the scribe lines 110 and 112 intersect and proximate to the corners 122 of the adjacent dies 102. The corner region 120 may further include portions of the scribe line 110 that extend from the intersecting region (at both sides) by a distance (D1) and portions of the scribe line 112 that extend from the intersecting region (at both sides) by a distance (D2). In the present embodiment, the distances (D1 and D2) may range from about 0.1 um to about 300 um. A dummy metal structure 202 may be formed within the corner region 120.

The dummy metal structure 202 may be formed in the same process that forms a multi-layer interconnection structure for the semiconductor dies 102. The interconnection structure may include a plurality of metal layers with each metal layer being disposed within a dielectric layer (e.g., inter-layer or inter-level or inter-metal dielectric). Accordingly, the dummy metal structure 202 may be formed within one or more of the dielectric layers as will be discussed later below. In the present embodiment, the dummy metal structure 202 may include a plurality of squares in a checker board pattern. Alternatively, the dummy metal structure 202 may optionally include other shapes such as rectangular, circular, semi-circular, polygon, irregular shapes, or combinations thereof. The dummy metal structure 202 may include a width 204 that ranges from about 0.1 um to about 5 um. The dummy metal structure 202 may be sized such that a pattern density of the dummy metal structure 202 ranges from about 20% to about 80% of the corner region 120. In other words, a dummy metal pattern may occupy 20% to 80% of an area of the corner region 120.

It has been observed that providing the dummy metal structure 202 within the corner region 120 may reduce some stress at an interface between the dielectric layers. Accordingly, the dummy metal structure 202 may improve a die-saw quality of the scribe lines 110, 112 and thus the risk of peeling and/or delamination of the dielectric layers may be reduced. It should be noted that the shape of the dummy metal pattern may be rounded at the corners due to the patterning process including photolithography and etching processes.

Figure 3:
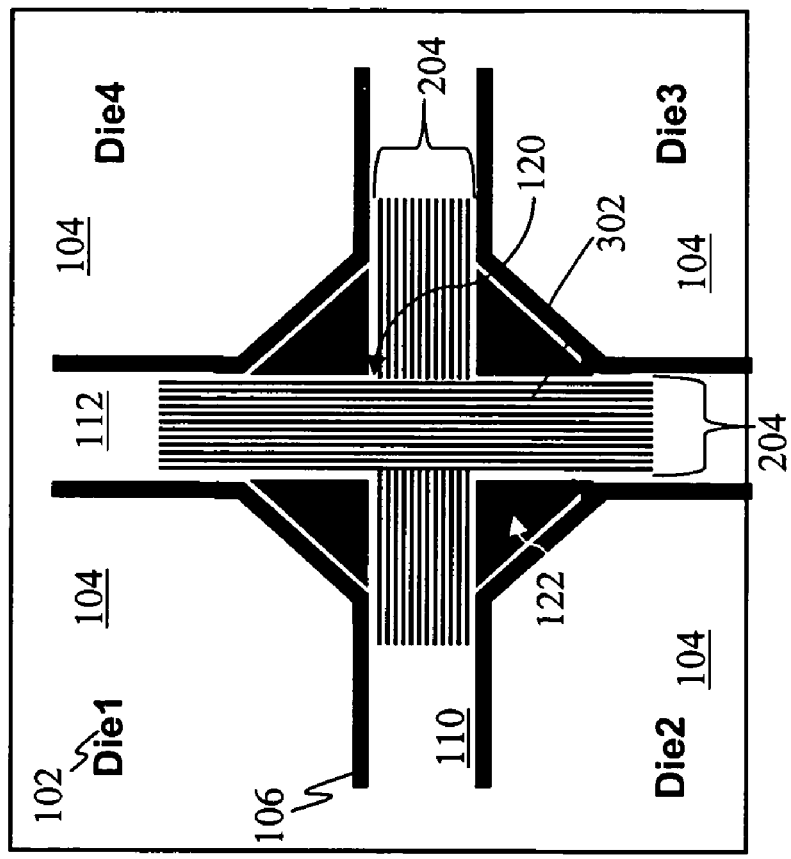
FIG. 3 is a top view of part a semiconductor wafer with an alternative dummy metal structure located within a corner region that improves die saw quality according to various aspects of the present disclosure.

Referring to FIG. 3, illustrated is a top view of part of a semiconductor wafer 300 with an alternative dummy metal structure located within a corner region. The semiconductor wafer 300 is similar to the semiconductor wafer 200 of FIG. 2 except for a configuration and shape of the dummy metal features. Accordingly, similar features in FIGS. 2 and 3 are numbered the same for the sake of clarity and simplicity. The semiconductor wafer 300 may include a dummy metal structure 302 located within the corner region 120. The dummy metal structure 302 may include a plurality of parallel lines or slots. The dummy metal structure 302 may include a width 204 that ranges from about 0.1 um to about 5 um. The dummy metal structure 302 may be sized such that a pattern density of the dummy metal structure 302 ranges from about 20% to about 80% of the corner region 120. In other words, a dummy metal pattern may occupy 20% to 80% of an area of the corner region 120.

Figure 4:
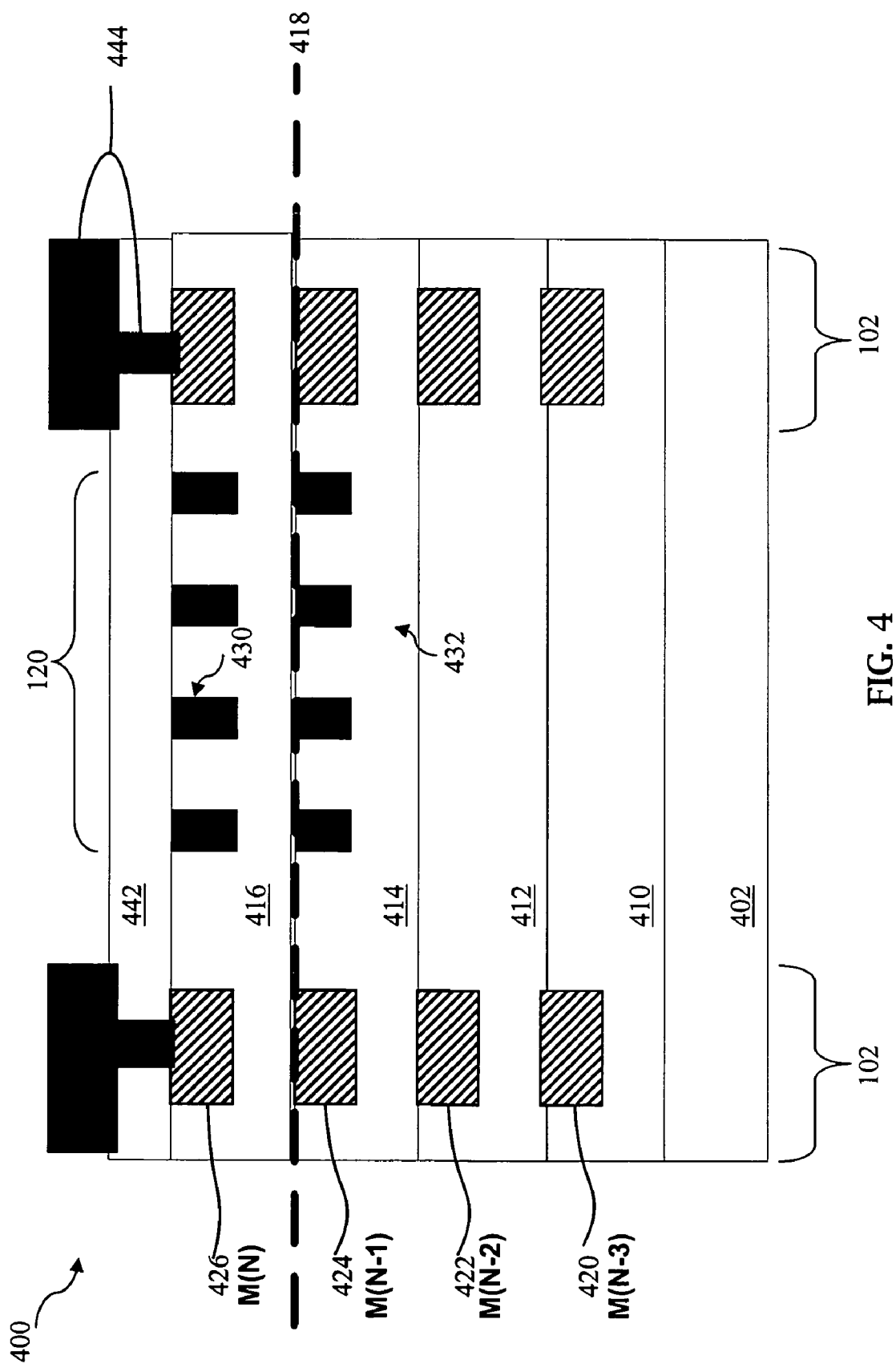
FIG. 4 is a cross-sectional view of part of a semiconductor wafer with a dummy metal structure that improves die saw quality according to various aspects of the present disclosure.

Referring to FIG. 4, illustrated is a cross-section view of part of a semiconductor wafer 400 including a dummy metal structure according to various aspects of the present disclosure. The semiconductor wafer 400 may be similar to the semiconductor wafers 200, 300 of FIGS. 2 and 3. Accordingly, similar features in FIGS. 2-4 are numbered the same for the sake of clarity and simplicity. The semiconductor wafer 400 may include a plurality of semiconductor dies 102 that are separated and isolated from one another by scribe lines including a corner region 120. The semiconductor wafer 400 may include a semiconductor substrate 402; a plurality of dielectric layers 410, 412, 414, 416 (referred to as inter-metal dielectric layers); an interface 418; a plurality of metal layers 420, 422, 424, 426 with each metal layer being disposed in one of the dielectric layers 410-416; dummy metal structures 430, 432 located within the corner region 120; and a passivation layer 442 including a bond/bump pad structure 444. It is understood that the semiconductor wafer 400 may also include other features and structures such as via/contact structures that interconnect the various metal layers 410-416 as is known in the art.

The semiconductor substrate 402 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In another embodiment, the alloy SiGe is formed over a silicon substrate. In another embodiment, a SiGe substrate is strained. Furthermore, the semiconductor substrate 402 may be a semiconductor on insulator, such as a silicon on insulator (SOI), or a thin film transistor (TFT). In some examples, the semiconductor substrate 402 may include a doped epi layer or a buried layer. In other examples, the compound semiconductor substrate may have a multilayer structure, or the substrate may include a multilayer compound semiconductor structure. The semiconductor substrate 402 may be doped, either heavily or lightly, with p-type or n-type dopants as is known in the art.

Each semiconductor die 102 may include an integrated circuit region with a variety of active and passive devices, such as metal-oxide-semiconductor field effect transistors (MOSFETs), bipolar junction transistors (BJTs), high power transistors, high frequency transistors, memory cells, devices having fuse features, resistors, capacitors, inductors, diodes, other suitable components, or combinations thereof. The variety of active and passive devices may be formed in the substrate 402. The dielectric layers 410-416 and metal layers 420-426 may be part of an multi-layer interconnection structure for interconnecting the various active and passive devices of the semiconductor die 102 to form an integrated circuit.

The plurality of metal layers 420-426 may include N metal layers, where the topmost metal layer is denoted as M(N). In the present embodiment, the plurality of metal layers comprises four metal layers (N=4), M(1) through M(4), metal structure 420 being M(N−3) or M1, metal structure 422 being M(N−2) or M2, 424 being M(N−1) or M3, and metal structure 426 being the topmost metal structure, M(N) or M4. Also, the metal layers 420-426 are disposed within the dielectric layers 410-416, respectively, to isolate the metal layers from one another. It should be noted that additional metal layers are typically found in semiconductor devices but only four (4) metal layers are shown herein for the sake of simplicity and clarity.

In present embodiment, the dielectric layers 410-414 and the dielectric layer 416 may include different dielectric materials. It is advantageous to form the dielectric layers 410-414 with low-K (LK), extreme low-K (ELK), and/or extra low-k (XLK) materials in order to enhance circuit performance. The material classification may be based upon a dielectric constant or k value. For example, LK materials may refer to those materials with a k less than approximately 3.5, and preferably less than approximately 3.0. The ELK materials may refer to those materials with a k less than approximately 2.9, and preferably less than approximately 2.6. The XLK materials may refer to those materials which typically have a k value less than approximately 2.4. It is understood that the classifications are mere examples and that other classifications based on the dielectric constant of the material may be utilized as well. The LK, ELK, and/or XLK dielectric materials may comprise silicon nitride, silicon oxynitride, spin-on glass (SOG), fluorinated silica glass (FSG), carbon doped silicon oxide (e.g., SiCOH), carbon-containing material, Black Diamond® (Applied Materials of Santa Clara, Calif.), Xerogel, Aerogel, amorphous fluorinated carbon, Parylene, BCB (bis-benzocyclobutenes), Flare, SiLK (Dow Chemical, Midland, Mich.), polyimide, other proper porous polymeric materials, other suitable dielectric materials, and/or combinations thereof.

In present embodiment, the dielectric layer 416 includes an un-doped silicate glass (USG) which typically has a k value of approximately 4.1. For example, the dielectric layers 410-414 includes a ELK material, and the dielectric layer 416 includes USG material. The dielectric layers 410-416 may be formed by a suitable process, such as spin-on coating, chemical vapor deposition (CVD), physical vapor deposition (PVD), atomic layer deposition (ALD), other suitable processes, and/or combinations thereof. The interface 418 represents where the ELK dielectric layer 414 (of the second topmost metal layer M(N−1)) and the USG dielectric layer 416 (of the topmost metal layer M(N)) meet. In alternative embodiments, any combination of LK, ELK, XLK, USG, Boron-Doped Phosphosilicate Glass (BPSG), and other suitable dielectric materials may be utilized to form the dielectric layers 410-416.

Though the LK, ELK, and XLK dielectric materials enhance circuit performance, such materials exhibit poor mechanical strength and thus tend to peel/delaminate under stresses induced by die-sawing, particularly at the interface 418 between the topmost metal layer M(N) 426 and the second topmost metal layer M(N−1) 424. The dummy metal structures 430, 432 effectively reduce such stresses and reduce the risk of peeling/delamination of the dielectric layers particularly at the corners of the dies 102. That is, inserting the dummy metal structures 430, 432 may release the residue (or interfacial) stress at the interface between the topmost metal layer M(N) 426 and the second topmost metal layer M(N−1) 424 to improve die saw quality of semiconductor wafer 400. The dummy metal structures 430, 432 may be similar to the dummy metal structures 202, 302 of FIGS. 2 and 3. For example, the shape, size, and pattern density of the dummy metal structures 430, 432 may be similar to the dummy metal structures 202, 302.

In the present embodiment, the dummy metal structures 430, 432 may be formed by the same process that forms the topmost metal layer M(N) 426 in the USG dielectric layer 416 and the second topmost metal layer M(N−1) 424 in the ELK dielectric layer 414 of the semiconductor dies 102. Accordingly, the dummy metal structures 430, 432 may be similar to the multi-layer interconnects formed in the integrated circuit region in composition, thickness, and formation. For example, the dummy metal structures 430, 432 may be formed in an integrated process, such as a damascene process or a dual damascene process, and further, vertical and horizontal features may be formed in various processes, such as photolithography and etching processes. In addition, the dummy metal structures 430, 432 may comprise aluminum, aluminum alloy, copper, copper alloy, titanium, titanium nitride, tantalum, tantalum nitride, tungsten, polysilicon, metal silicide, other suitable materials, and/or combinations thereof.

In some embodiments, the dummy metal structures 430, 432 may extend entirely throughout the dielectric layers 414, 416 and through the interface 418; may only extend to the interface 418; may extend only through the dielectric layer 414 or only through the dielectric layer 416; and/or combinations thereof to reduce corner peeling. Further, dummy metal structures may be formed in any combination of the dielectric layers of the multi-layer interconnection structure. It has been observed that more stress is reduced when a dummy metal structure is formed in more layers of low-k dielectric materials.

The passivation layer 442 may be deposited above the dielectric layer 416 including the top most metal layer M(N) 426 to cover and protect the metal layers 420-426 and the dielectric layers 410-416. The passivation layer 442 may comprise silicon oxide, silicon nitride, silicon oxynitride, any other suitable material, and/or combinations thereof. Further, the passivation layer 442 may be formed by chemical vapor deposition (CVD), spin-on coating, or other suitable techniques. The bond/bump pad structures 444 may be formed on the topmost metal layer M(N) 426. The bond/bump pad structure 444 may be formed within the passivation layer 442 by a process known in the art. The bond/bump pad structure 444 may comprise an electrically conductive material, such as aluminum, aluminum alloy, copper, copper alloy, other suitable conductive materials, and/or combinations thereof.

Figure 5:
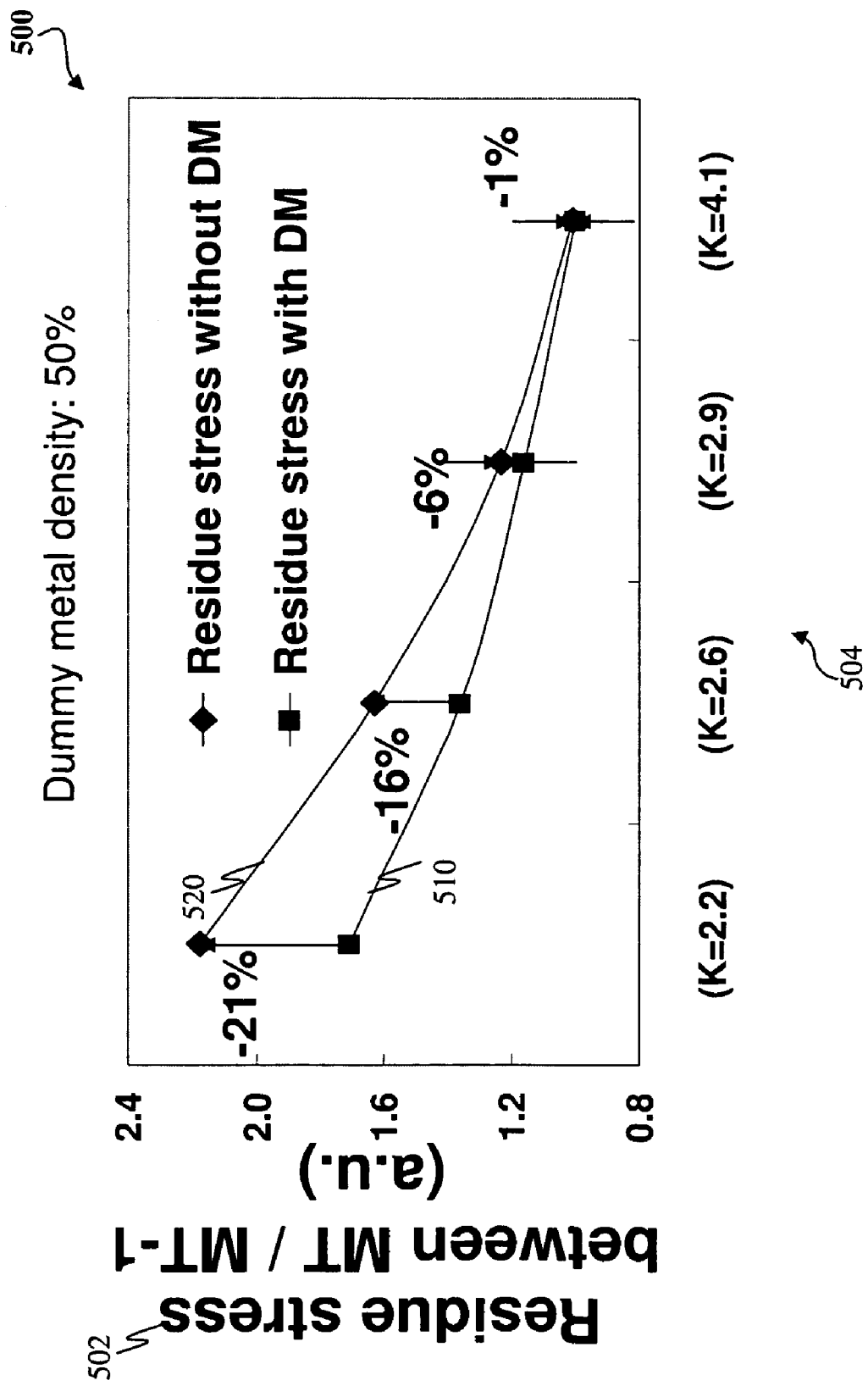
FIG. 5 is a graph illustrating a relationship of a residue stress with and without a dummy metal structure for dielectric layers with varying k values.

Referring to FIG. 5, illustrated is a graph 500 showing a relationship of a residue (or interfacial) stress 502 (at an interface between the topmost metal layer M(N) and the second topmost metal layer M(N−1)) for dielectric materials with varying k values 504. The dielectric materials 504 include materials having k values of (k=4.1), (k=2.9), (k=2.6), and (k=2.2). The interface is similar to the interface 418 of FIG. 4. The graph 500 includes a line 510 that represents the residue stress for a semiconductor wafer with a dummy metal structure (similar to the semiconductor wafers 200, 300, 400 of FIGS. 2-4) and a line 520 that represents the residue stress for a semiconductor wafer without a dummy metal structure (similar to the semiconductor wafer 100 of FIG. 1). From the graph 500, it has been observed that the residue stress at the interface (between topmost metal layer M(N) and second topmost metal layer M(N−1)) is reduced for all the different dielectric layers 504 when utilizing a dummy metal structure. More specifically, the residue stress is dramatically reduced in dielectric layers having a k value less than approximately 2.6, such as, for example in ELK materials the residue stress is reduced by 16% and for the XLK material the residue stress is reduced by 21%. In other words, the dummy metal structure has a dominating stress reducing effect for dielectric materials with k values less than approximately 2.6.

Figure 6:
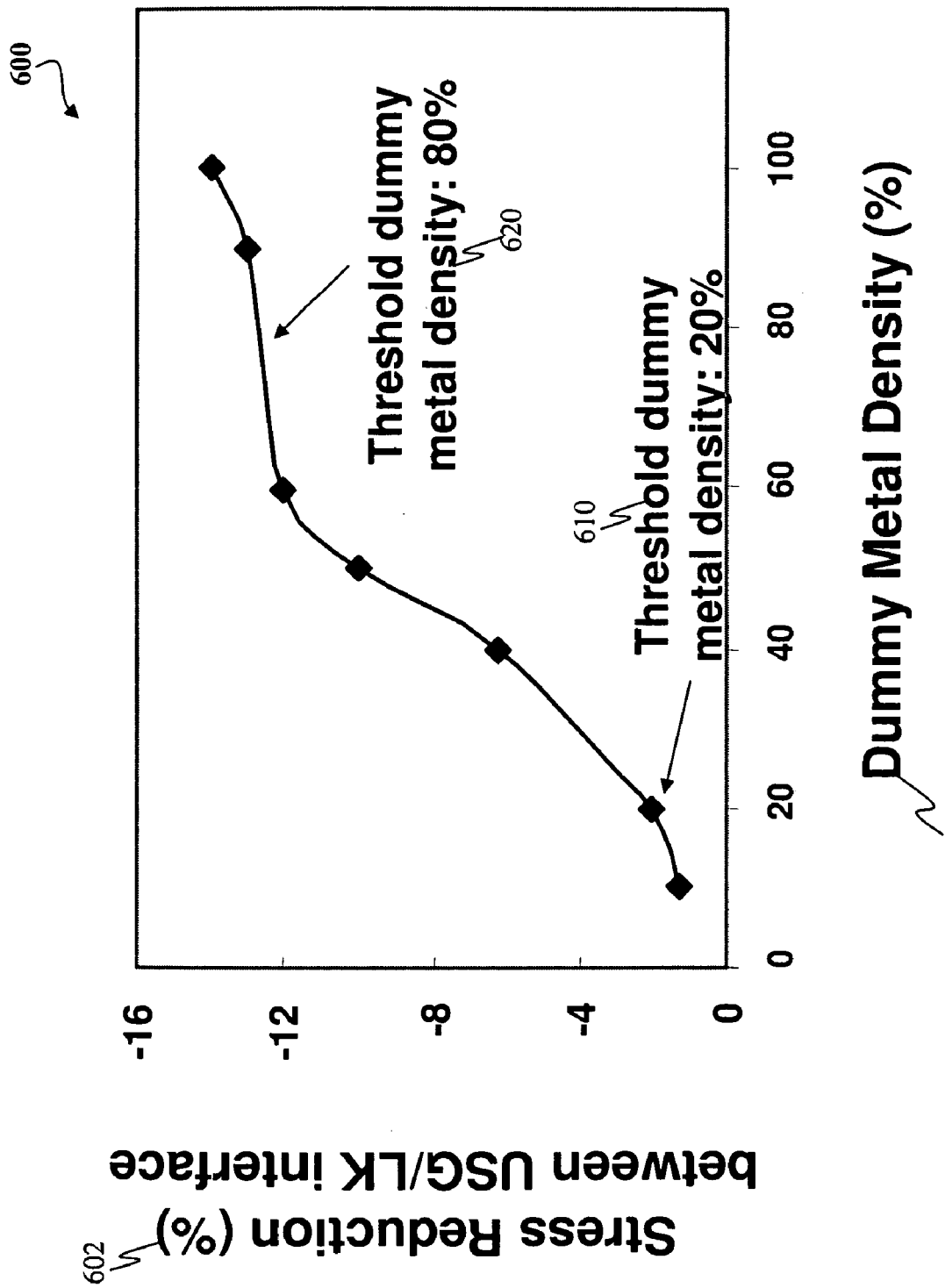
FIG. 6 is a graph illustrating a relationship of a residue stress reduction percentage for varying dummy metal pattern densities.

Referring to FIG. 6, illustrated is a graph 600 showing a relationship of a residue stress reduction percentage 602 for varying dummy metal pattern densities 602. The residue (or interfacial) stress is measured at an interface between a topmost metal layer M(N) formed in USG (k=4.1) dielectric layer and a second topmost metal layer M(N−1) formed in ELK (k=2.6) dielectric layer. Accordingly, the stress reduction percentage 602 for the different dummy metal pattern densities may be calculated with respect to a semiconductor wafer without a dummy metal structure. The dummy metal pattern densities 604 may calculated as a percentage an area of the corner region (similar to the corner region 120 of FIGS. 2 and 3) that includes a dummy metal pattern. That is, the dummy metal pattern density=M/A, where M is the total area of the dummy metal features and A is the total area of the corner region. From the graph 600, it has been observed that the dummy metal pattern density has a lower threshold 610 of approximately 20% and an upper threshold 620 of approximately 80%.

Overall, the disclosed embodiments provide one or more of the following advantages: (1) the dummy metal structure effectively releases stress induced by the integrated circuit manufacturing BEOL processes, such as dicing/die-sawing; (2) the dummy metal structure is formed within the scribe lines, thus not occupying the integrated circuit region; (3) by releasing induced stresses, the dummy metal structure effectively reduces corner peeling and/or delamination during the die-sawing process; (4) the dummy metal structure improves yield; (5) the dummy metal structure is easily fabricated at a low cost without requiring any additional expenses; and (6) the dummy metal structure may be fabricated without adversely affecting other processes required to manufacture semiconductor wafers/dies. It is understood that different embodiments disclosed herein offer different advantages, and that no particular advantage is necessarily required for all embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor wafer, comprising:
   a semiconductor substrate;
   a plurality of dies formed on the semiconductor substrate, the plurality of dies being separated from one another by a first region extending along a first direction and a second region extending along a second direction different from the first direction;
   a dummy metal structure formed within a third region that includes a region defined by an intersection of the first region and the second region; a plurality of metal interconnection layers formed over the substrate, wherein each of the plurality of metal interconnection layers is disposed within one of a plurality of dielectric layers and wherein a dielectric constant of at least one of the plurality of dielectric layers is less than about 2.6; and
   wherein the dummy metal structure includes a first dummy metal structure formed in the at least one of dielectric layers having a dielectric constant less than about 2.6 and a second dummy metal structure in the one of dielectric layers having a dielectric constant greater than about 2.6.

2. The semiconductor wafer of claim 1, wherein the at least one of the plurality of dielectric layers has a dielectric constant that is less than 2.2.

3. A semiconductor wafer, comprising:
   a semiconductor substrate;
   a plurality of dies formed on the semiconductor substrate, the plurality of dies being separated from one another by a first region extending along a first direction and a second region extending along a second direction different from the first direction;
   a dummy metal structure formed within a third region that includes a region defined by an intersection of the first region and the second region; and
   a plurality of metal interconnection layers formed over the substrate, wherein each of the plurality of metal interconnection layers is disposed within one of a plurality of dielectric layers and wherein a dielectric constant of at least one of the plurality of dielectric layers is less than about 2.6;

wherein the plurality of metal interconnection layers include an upper metal layer and a lower metal layer;

wherein the lower metal layer is disposed in the at least one of dielectric layers that has a dielectric constant less than about 2.6;

wherein the upper metal layer is disposed in one of the plurality of dielectric layers that overlies the at least one of the dielectric layers, the one of the plurality of dielectric layers having a dielectric constant greater than about 2.6; and wherein the dummy metal structure includes a first dummy metal structure formed in the at least one of dielectric layers having a dielectric constant less than about 2.6 and a second dummy metal structure in the one of dielectric layers having a dielectric constant greater than about 2.6.

4. The semiconductor wafer of claim 3, wherein the at least one of the plurality of dielectric layers having a dielectric constant less than 2.6 includes a carbon-containing dielectric material.

5. The semiconductor wafer of claim 4, wherein the one of the plurality of dielectric layers having a dielectric constant greater than 2.6 includes an un-doped silicate glass (USG).

6. The semiconductor wafer of claim 1, wherein the dummy metal structure includes a plurality of squares, a plurality of rectangles, or a plurality of parallel lines.

7. The semiconductor wafer of claim 1, wherein a pattern density of the dummy metal structure ranges from about 20% to about 80% of the third region.

8. The semiconductor wafer of claim 1, wherein the plurality of dies include a first die having a first corner, a second die having a second corner, a third die having a third corner, and a fourth die having a fourth corner;

wherein the first, second, third, and fourth corners are adjacent to the third region;

wherein the first, second, third, and fourth corners each have a first length measured in the first direction and a second length measured in the second direction; and wherein the third region further includes portions of the first region that extend from the intersection region by the first length and portions of the second region that extend from the intersection region by the second length.

9. The semiconductor wafer of claim 8, wherein the first length is less than about 300 um and wherein the second length is less than about 300 um.

10. The semiconductor wafer of claim 9, wherein the dummy metal structure includes a first width measured in the first direction, the first width being less than or equal to about 5 um; and wherein the dummy metal structure includes a second width measured in the second direction, the second width being less than or equal to about 5 um.

* * * * *